(12) United States Patent
Inoue et al.

(10) Patent No.: US 6,213,386 B1
(45) Date of Patent: Apr. 10, 2001

(54) METHOD OF FORMING BUMPS

(75) Inventors: Kosuke Inoue, Fujisawa; Asao Nishimura, Kokubunji; Takamichi Suzuki, Yokohama; Teru Fujii, Chigasaki; Masayuki Morishima, Yokohama; Yasuyuki Nakajima, Akishima; Noriyuki Oroku, Yokohama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/315,818

(22) Filed: May 21, 1999

(30) Foreign Application Priority Data

May 29, 1998 (JP) .................................................. 10-148711

(51) Int. Cl.[7] .................................................. B23K 35/12
(52) U.S. Cl. ............................................ 228/245; 228/246
(58) Field of Search ...................................... 228/245, 246

(56) References Cited

U.S. PATENT DOCUMENTS

| | | | |
|---|---|---|---|
| 4,460,108 | * | 7/1984 | Noda et al. .............................. 221/94 |
| 4,871,110 | * | 10/1989 | Fukasawa et al. ................... 228/245 |
| 4,906,823 | * | 3/1990 | Kushima et al. ..................... 228/245 |
| 5,118,027 | * | 6/1992 | Braun et al. ....................... 228/180.2 |
| 5,219,117 | * | 6/1993 | Lin ........................................ 228/253 |
| 5,279,045 | * | 1/1994 | Odashima et al. ....................... 34/10 |
| 5,284,287 | * | 2/1994 | Wilson et al. ..................... 228/180.2 |
| 5,324,569 | * | 6/1994 | Nagesh et al. ........................ 428/198 |
| 5,431,332 | * | 7/1995 | Kirby et al. .......................... 228/246 |
| 5,620,129 | * | 4/1997 | Rogren ................................. 228/56.3 |
| 5,729,894 | | 3/1998 | Rostoker, et al. . |
| 5,839,641 | * | 11/1998 | Teng ....................................... 228/41 |

FOREIGN PATENT DOCUMENTS

96/42107    12/1996   (WO) .

* cited by examiner

*Primary Examiner*—Patrick Ryan
*Assistant Examiner*—Zidia T. Pittman
(74) *Attorney, Agent, or Firm*—Antonelli, Terry, Stout & Kraus, LLP (57) ABSTRACT

In the conventional bump forming method that can be applied to a semiconductor device in which a large number of bumps are required to form, there are various limitations to the material of which the bumps are made, to enough cubic volume of bumps and to small scattering of the bump height. According to the invention, solder balls and a tool having a large number of through-holes are used, and under the condition that the through-holes of the tool are aligned with the pads of the semiconductor device, the solder balls are charged into the through-holes, pressed to be fixed on the pads, and then reflowed to form bumps.

21 Claims, 7 Drawing Sheets

METHOD OF FORMING BUMPS

BACKGROUND OF THE INVENTION

The present invention relates to a method of forming bumps as electrical, mechanical and thermal connections or contacts on a semiconductor device.

There are many examples as to the method of forming bumps on a semiconductor device. For example, metal is deposited by plating to form bumps on the pads of a semiconductor device (plating method); a solder paste is printed on the pads of a semiconductor device, heated so that solder particles within the paste are melted, and thereafter solidified to form bumps on the pads (printing method); and one end of gold wire is bonded to a pad, and then the wire is cut so that the bonded part of wire is left as a bump(wire bonding method). In addition, as disclosed in U.S. Pat. No. 5,284,287, solder balls are sucked in the cavities of a pick-up tool by vacuum, placed on the pads of a semiconductor device, and heated to melt, and solidified to form bumps (conventional type solder ball method).

These conventional methods, however, have the following drawbacks. In general, the larger the cubic volume of the bumps, the longer the life of the connection between the semiconductor device and an electronic circuit board through the bumps can be extended. In the plating method and printing method, however, it is difficult in principle to form bumps of enough cubic volume. Moreover, since the heights of the bumps scatter, all the bumps cannot be properly connected between the semiconductor device and the electronic circuit board. In the wire bonding method, the material of the wire is limited to only a particular one such as gold. Also, since bumps are produced one by one, it takes a very long time, one hour or more to produce many pads as for a semiconductor device having tens of thousands pads.

In the conventional type solder ball method, the scattering of the bump height is small, and bumps of enough volume can be produced, but the pick-up tool for use in sucking balls by vacuum to hold is complex in structure and requires a delicate perforating technique for very fine holes or cavities when it is produced. Since this tool becomes expensive in proportion to the number of holes required, the cost of forming bumps increases when the tool is used for a semiconductor device that needs a large number of bumps.

SUMMARY OF THE INVENTION

It is an object of the invention to provide a method of forming bumps of enough cubic volume which have small scattering of bump height and no limitation to material to be selected, and which method can be used for the bumps of a semiconductor device that needs a large number of bumps, or is able to produce bumps fast and at low cost, thus providing low-cost semiconductor devices to the market.

In order to achieve the above object, the present invention has executed the following means. First, conductive spheres such as solder balls are fundamentally used in order to provide bumps of enough cubic volume with small scattering of bump height and with no limitation to material to be selected. In addition, to actualize the high-speed low-cost production of bumps that can be applied to the production of bumps in a semiconductor device that needs a large number of bumps, low cost tools such as a printing metal stencil and brush that are moved in parallel are used to place a large number of solder balls on a semiconductor device at a time, which are then pushed against the pads of the semiconductor device by a pressing tool so that the bumps to be formed can be prevented from being defective, and thereafter the solder balls are heated to form bumps. Moreover, it is checked if the produced bumps are excessive or insufficient, and if necessary, re-trying operation is performed.

DETAILED DESCRIPTION OF THE EMBODIMENTS

Figure 1:
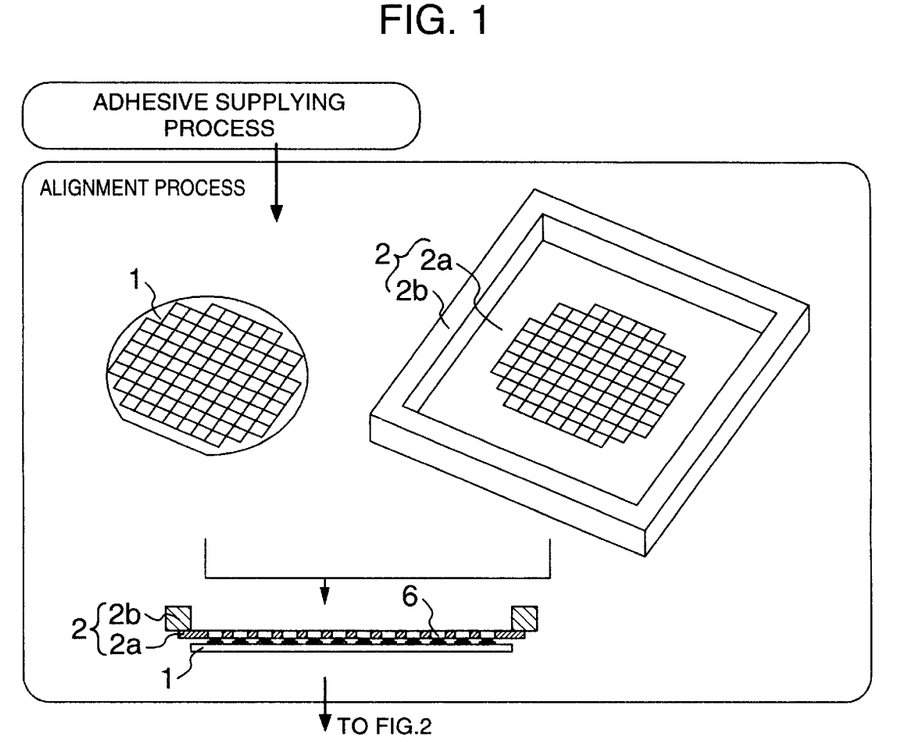
FIG. 1 is part of a flow diagram of bump formation according to the invention.
Figure 2:
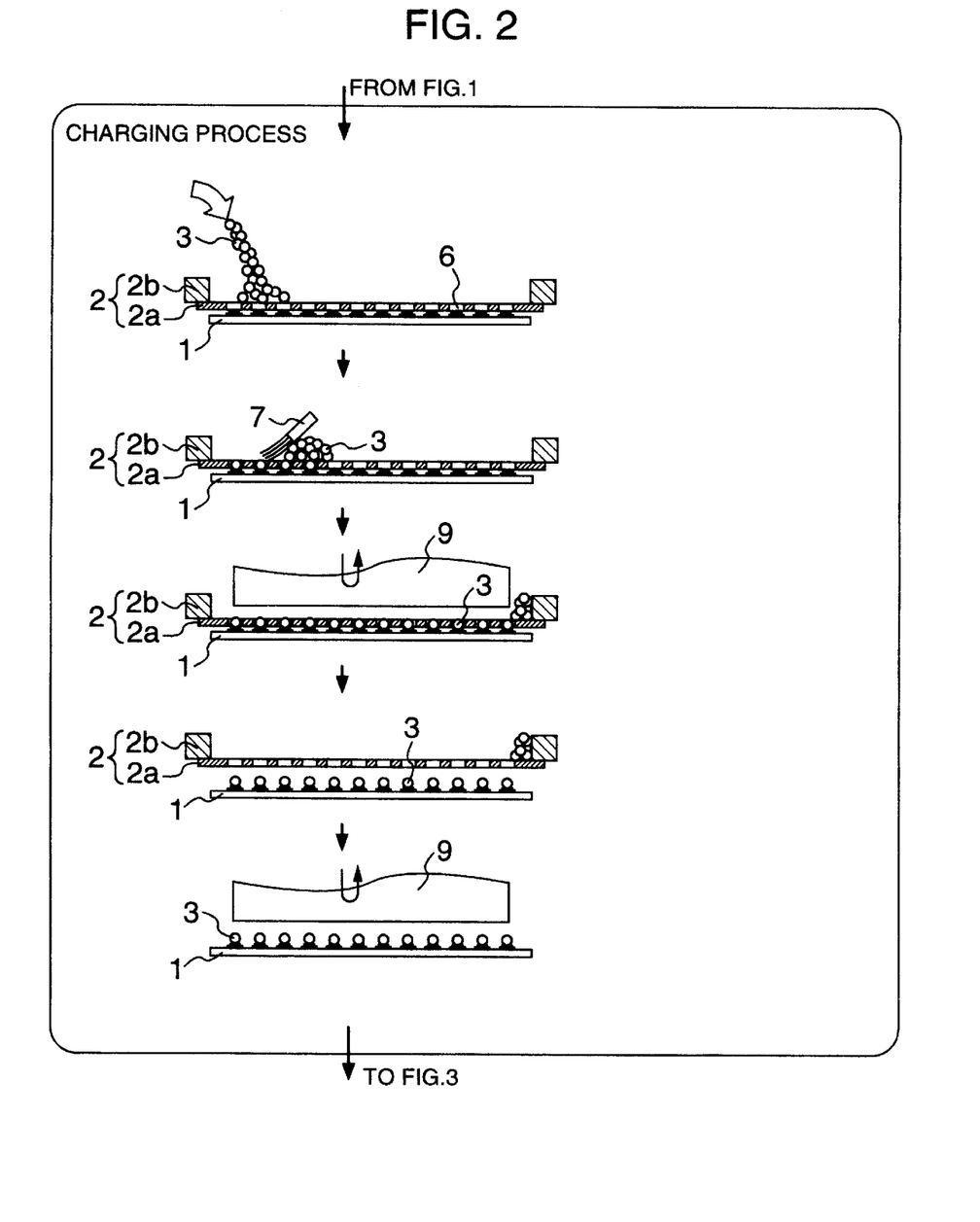
FIG. 2 is another part of a flow diagram of bump formation according to the invention.
Figure 3:
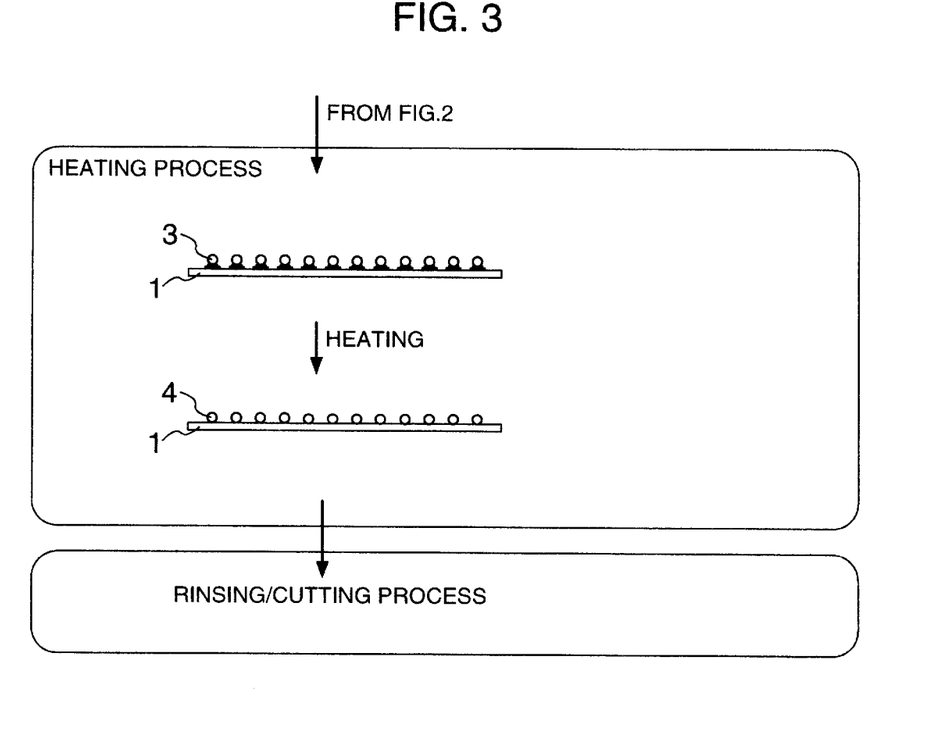
FIG. 3 is the last part of a flow diagram of bump formation according to the invention.
Figure 4:
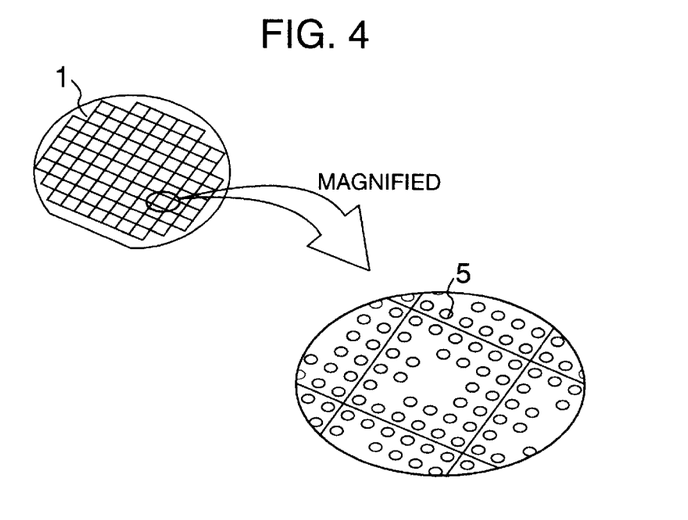
FIG. 4 is a diagram of an example of a semiconductor device and a magnified part thereof.
Figure 5:
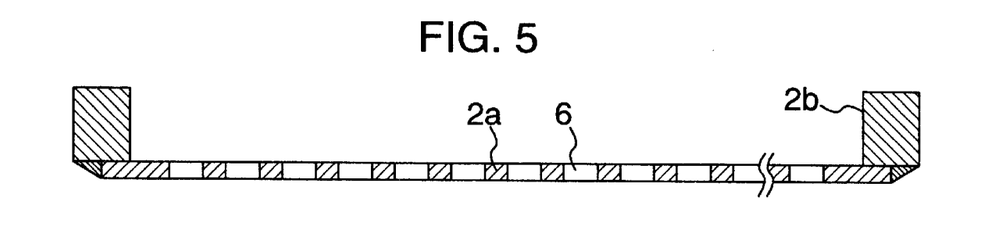
FIG. 5 is a diagram of a tool for use in this invention.

An embodiment of the invention will be described with reference to FIGS. 1 to 16. In those figures, like elements are identified by the same reference numerals, and will not be described. FIGS. 1, 2 and 3 show a fundamental flow of the bump formation according to the invention. The bump formation flow according to the invention basically includes an alignment process, a ball charging process and a heating process as illustrated in FIGS. 1, 2 and 3. These processes will hereinafter be described in order, with reference to other figures, if necessary. Referring to FIGS. 1, 2 and 3, there are shown a semiconductor device 1 on which bumps are to be formed, a tool 2, conductive spheres 3, completed bumps 4, through-holes 6 of the tool 2 that will be described later, a brush 7, and a pressing tool 9. In addition, there are shown a stencil 2a of the tool 2, and a frame 2b of the tool 2. Although the semiconductor device 1 on which bumps can be formed according to the invention may be of different types such as a wafer not protected, a wafer protected with resin, a cut-away part of the wafer and a packaged cut-away part of the wafer, a wafer-shaped semiconductor device is used as an example of the semiconductor device 1. This is because the effect of the invention is generally great on forming bumps of a wafer-type semiconductor device that needs a large number of bumps. FIG. 4 shows the semiconductor device 1 on which bumps are formed according to the embodiment of the invention, and a magnified part of the device. The semiconductor device 1 has a large number of pads 5 on which bumps are to be formed, for example, at most tens of thousands of pads 5. The tool 2 is formed by the frame 2b and the stencil 2a as illustrated by the cross-sectional view of FIG. 5. The stencil 2a has through-holes 6 formed to oppose to the pads 5 of the semiconductor device 1. This stencil 2a can be made of a material of metal or resin. The diameters of the through-holes 6 are in the range from that of the electric-conductive spheres 3 to less than twice that of the spheres 3 that are used in the charging process. The through-holes 6 of this tool 2 can be formed by machining using a drill or by a chemical process such as etching or electroforming. If an appropriate one of those processes is selected according to the number of through-holes 6, the through-holes can be formed in the tool 2 at a relatively low cost.

Figure 6A:
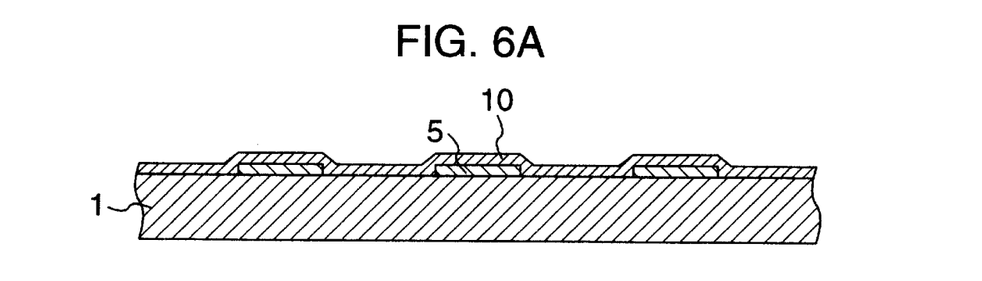
FIGS. 6A and 6B are diagrams of the semiconductor device with flux provided.
Figure 6B:
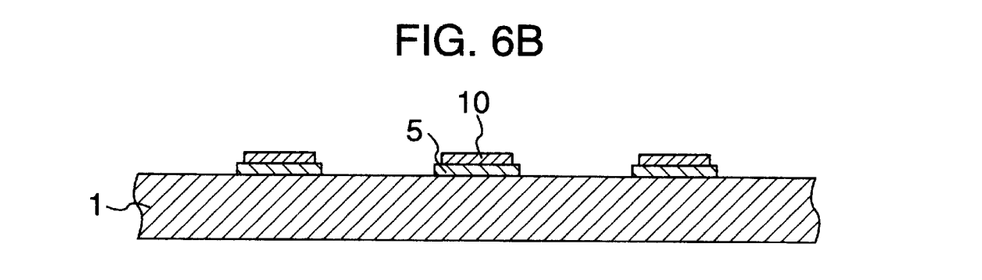

The bump formation flow is as follows. First, an adhesive supply process is executed to supply an adhesive on the pads 5 of the semiconductor device 1. This adhesive may be flux, solder paste or conductive adhesive. The adhesive such as flux is supplied by printing with a stencil or by spin coating using the centrifugal force. FIGS. 6A and 6B are cross-sectional diagrams of part of the semiconductor device 1 with an adhesive 10 provided on the pads 5 of the semiconductor device 1. FIG. 6A shows the adhesive 10 coated over the entire surface of the semiconductor device 1 including the pads 5, and FIG. 6B shows the adhesive 10 selectively coated only on the pads of the device 1.

Figure 7:
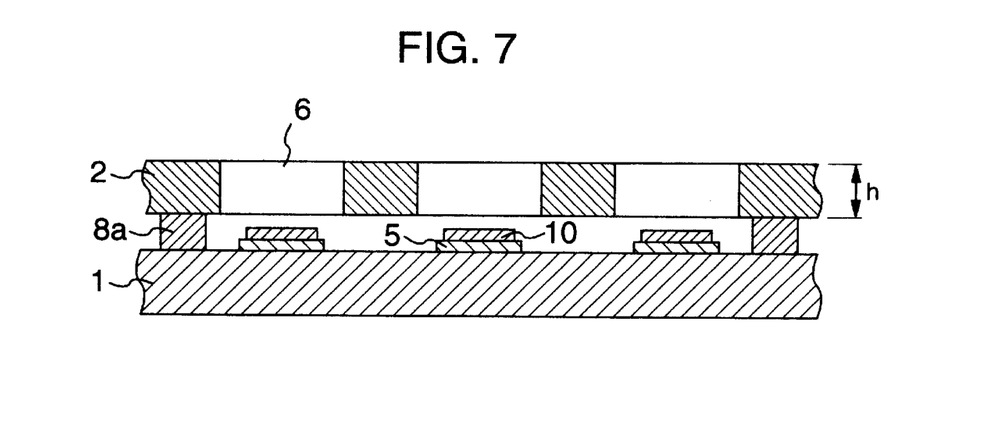
FIG. 7 is a diagram of the tool and the semiconductor device aligned with each other, and which have a gap set between the stencil of the tool and the semiconductor device by a rectangular spacer.
Figure 8:
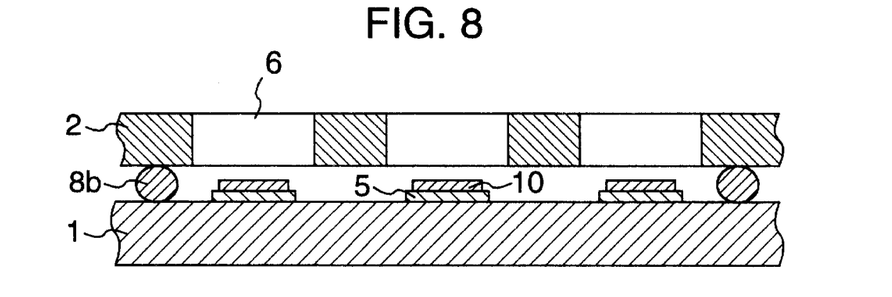
FIG. 8 is a diagram of the tool and the semiconductor device aligned with each other, and which have a gap set between the stencil of the tool and the semiconductor device by a wire-shaped spacer.
Figure 9:
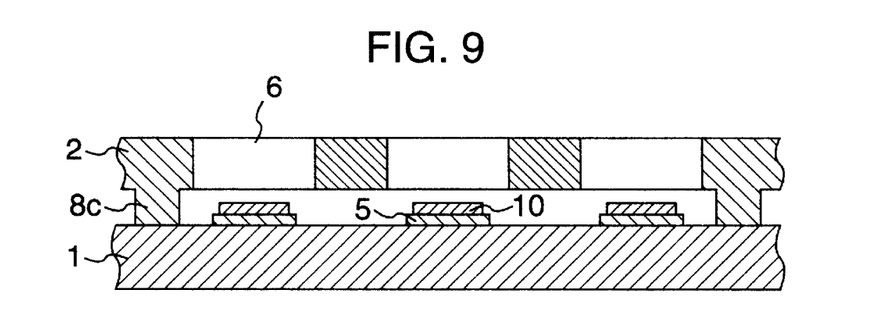
FIG. 9 is a diagram of the tool and the semiconductor device aligned with each other, and which have a gap set between the stencil of the tool and the semiconductor device by a projection provided on the stencil surface.
Figure 10:
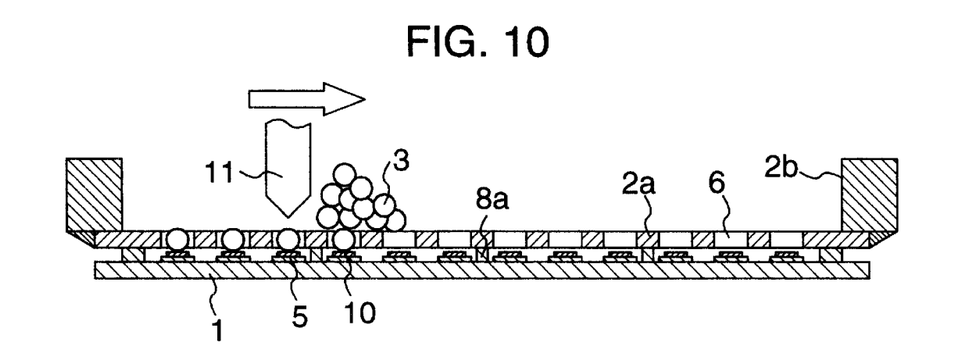
FIG. 10 is a diagram showing an example in which a squeegee is used for a charging process.
Figure 11:
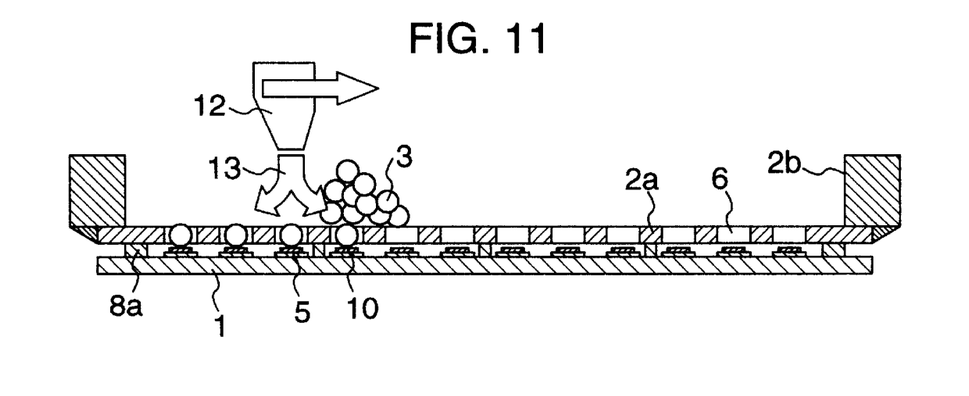
FIG. 11 is a diagram showing another example in which air flow is used for the charging process.
Figure 12:
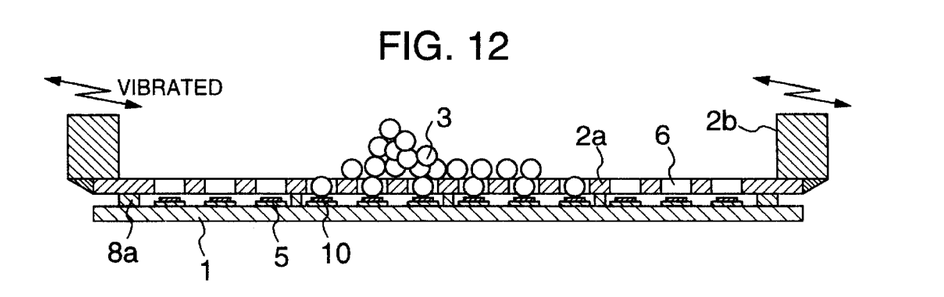
FIG. 12 is a diagram showing still another example in which vibration is used for the charging process.
Figure 13:
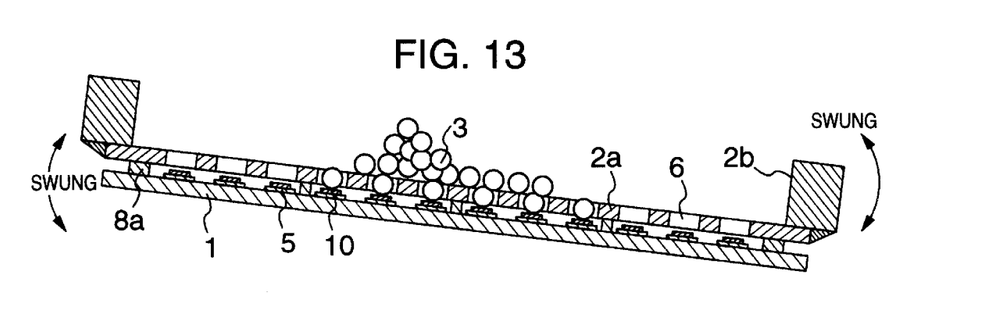
FIG. 13 is a diagram showing still further example in which the tool and the semiconductor device are tilted for the charging process.

Next, the alignment process is executed to align the pads 5 of the semiconductor device 1 with the through-holes 6 of the tool 2. The alignment is performed manually by usual recognition as in the stencil printer or automatically by using an automatic stage and the image processing that pays attention to the features of a video image picked up by a CCD camera. FIG. 7 is a magnified view of the completed alignment between the device 1 and the tool 2. In FIG. 7, there is shown a rectangular spacer 8a that is set between the device 1 and the tool 2 in order to fix the gap therebetween. FIG. 8 shows an example of using a wire-shaped spacer 8b. FIG. 9 shows an example of using a spacer 8c that is integrally formed with the tool 2. These spacers 8 can prevent the through-holes 6 from being contaminated with the adhesive 10 such as flux that is coated on the pads 5 of the semiconductor device 1. In other words, if the height of the spacer 8 is selected to be larger than that of the supplied adhesive 10 such as flux. There is no risk that the tool 2 is made in contact with the adhesive such as flux.

In the ball charging process, the conductive spheres 3 of which the number is larger than that of the bumps being formed are supplied on the tool 2. The supplied conductive spheres 3 are dropped down into the through-holes 6 of the tool 2 by the translational motion of the brush 7 shown in FIG. 2, or the through-holes 6 are charged with the conductive spheres 3. In addition, the excessive conductive spheres 3 on the tool 2 are removed from the regions in which the through-holes 6 occupy on the tool 2 by the translation of the brush 7. In order that the number of spheres 3 charged into one through hole 6 of the tool 2 is limited to one, the dimension h shown in FIG. 7 is required to be less than 1.5 times as large as the diameter of the conductive sphere 3. The charging of conductive spheres 3 into the though holes 3 of the tool 2 can be performed not only by using the brush 7, but also by using the translation of a squeegee 11 shown in FIG. 10, using an air flow 13 from an air nozzle 12 shown in FIG. 11, the vibration shown in FIG. 12 or the tilting of the tool 2 and device 2 shown in FIG. 13. Also, the excessive conductive spheres 3 can be removed from around the through-holes 6 by those means. Thereafter, if necessary, tests are made to examine if the through-holes 6 have been completely charged with the spheres, and if the excessive spheres 3 have been completely removed from around the through-holes 6, thus making sure of the processes. The tests can be performed by the usual recognition of the operator or by the automatic recognition using the combination of the electric CCD and image processor. If the charging operation and the excessive sphere removal are found not to be complete, the charging process is repeated, the spheres 3 are added, or the excessive conductive spheres 3 are directly removed by workers, thus solving those problems.

Figure 14:
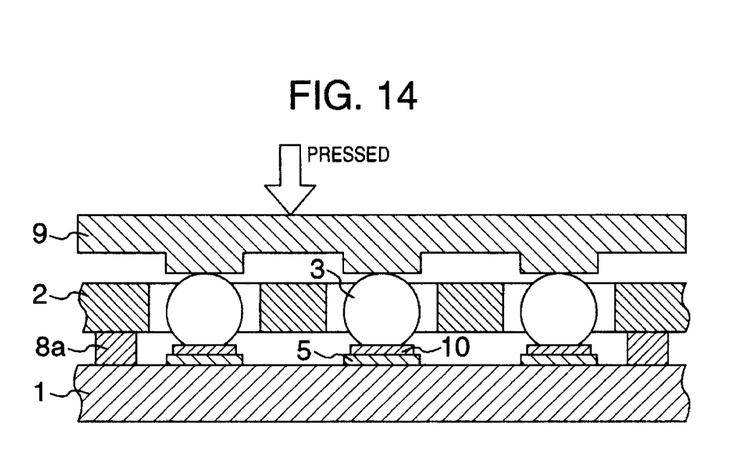
FIG. 14 is a diagram showing an example in which a pressing tool with projections is used when pressing.
Figure 15:
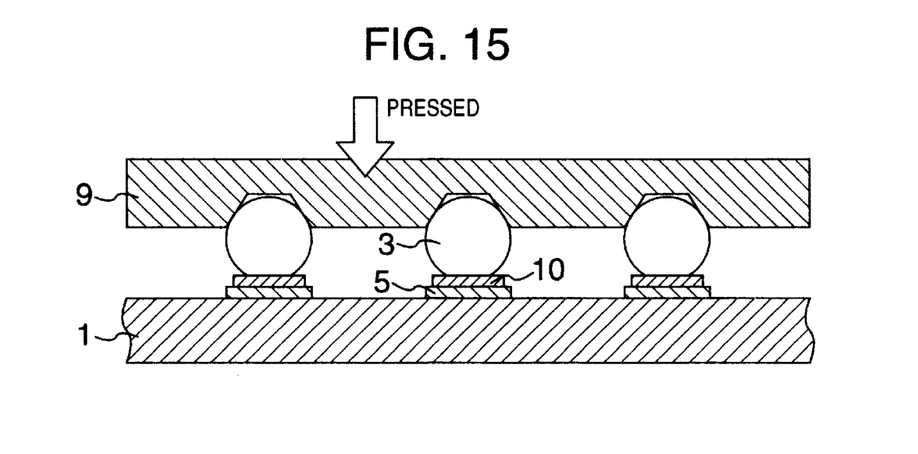
FIG. 15 is a diagram showing another example in which a pressing tool with recesses is used when pressing.
Figure 16:
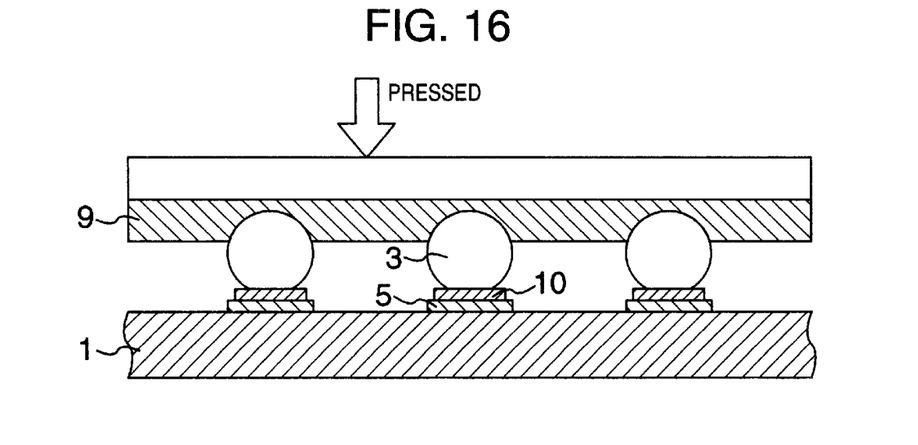
FIG. 16 is a diagram showing still another example in which a pressing tool with an elastic member provided on the pressing surface is used when pressing.
Figure 17:
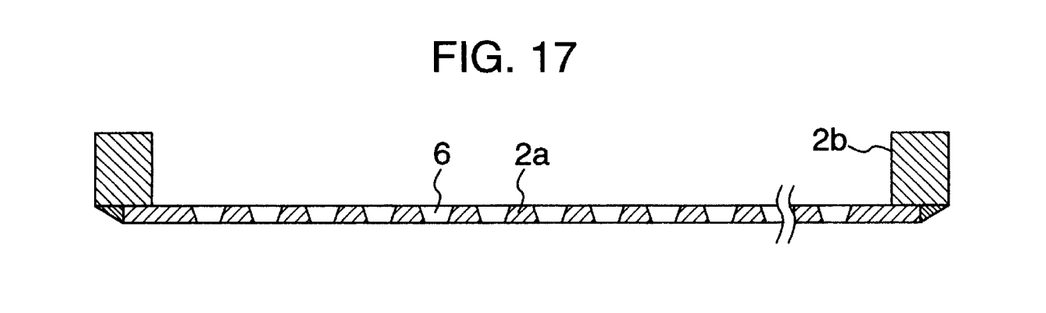
FIG. 17 is a cross-sectional diagram of the through-holes of the tool with their diameter changed in the direction of their center axis.

After the completion of the charging of conductive spheres into the through-holes 6 and the removal of excessive conductive spheres 3 from around the through-holes 6, the pressing tool 9 is moved up and down to press the conductive spheres 3 in the through-holes 6 against the semiconductor device. After the pressure, the tool 2 is lifted away from the semiconductor device 1. In this case, since the conductive spheres 3 stuffed in the through-holes 6 are pressed down, the spheres 3 are closely attached to the pads 5 and thus securely fixed on the pads 5 by the adhesion of the adhesive 10. Therefore, when the tool 2 is pulled up from the semiconductor device 1, the conductive spheres 3 are left on the semiconductor device 1, and they are never moved up with the tool 2 due to the positional deviation or sticking to the inner walls of the through-holes 6. In some case, after the tool 2 is pulled up, the conductive spheres 3 on the pads 5 may be again pressed by the pressing tool 9 in order to increase the effectiveness. By the second pressing, the displacement of spheres 3 that may be caused by the subsequent conveyance and heating process can be suppressed to the minimum. The pressing tool 9 may have not only simply a flat plate for pressing, but also projections shown in FIG. 14, recesses shown in FIG. 15 or an elastic body shown in FIG. 16. The pressing tool 9 having projections for use in pressing before the removal of the tool 2 has an effect of enabling the thickness of the stencil of the tool 2 to be made larger than the diameter of the conductive sphere as shown in FIG. 14. Thus, since the rigidity of the tool 2 can be enhanced, the life of the tool can be extended. By using the pressing tool 9 having recesses on the pressing side, it is possible to precisely position the conductive spheres 3 on the pads 5 of the semiconductor device 1. In addition, by using the pressing tool 9 having an elastic body on the pressing side, it is possible to press all the conductive spheres irrespective of the dimensional allowances. If an appropriate method of forming the through-holes 6, of which the diameter was described previously, is developed to be able to change the diameter of the through-holes 6 in the thickness direction of the stencil 2a of tool 2 as shown in FIG. 17, the conductive spheres 3 can be easily stuffed into the through-holes 6 and placed on the pads 5 of the device 1 with high precision. In this case, it is desired that on the side where the conductive spheres 3 are supplied, the diameter of the through-holes 6 be made as near to twice that of the sphere 3 as possible within the range from the diameter of the sphere 3 to twice that, and on the side of the pad 5 the diameter of the through-holes be made larger than but as near to that of the sphere 3 as possible.

In the following heating step, the semiconductor device 1 with the conductive spheres 3 mounted on the pads is placed in a heating furnace such as a commercially available reflow furnace. Thus, the conductive spheres 3 can be changed into the bumps 4 connected to the pads of the device 1. Thereafter, if necessary, the semiconductor device 1 is rinsed, and cut into necessary sizes, thus the device 1 with the bumps 4 being completed.

In this embodiment, tens of thousands of bumps can be formed at a time on the pads 5 of the semiconductor device 1, thus the mass productivity of bumps being remarkably improved.

According to the invention, a large number of bumps can be formed at a time on the pads of the semiconductor device. In addition, the tool and so on for the production of bumps can be used at low cost, and the device structure can be made simple. Moreover, since conductive spheres such as solder balls can be used as the bump material, bumps of different constituents can be formed. The bridging and ball vanishing problems sometimes caused when conductive spheres such as solder balls are used can be solved by providing the process for pressing the conductive spheres against the pads.

What is claimed is:

1. A method of forming bumps in which conductive spheres are used to form bumps on a semiconductor device, comprising the steps of:
   aligning a tool having through-holes with said semiconductor device so that said through-holes can be opposed to the places where said bumps are to be formed;
   supplying said conductive spheres on said tool, charging said conductive spheres into said through-holes of said tool and removing said tool from said semiconductor device as a ball charging process; and
   heating said conductive spheres and said semiconductor devices,
   wherein on the side of the tool where said conductive spheres are supplied the diameter of said through-holes of said tool is equal to or larger than the diameter of said conductive spheres used and less than twice that of said conductive spheres, and on the device side of the tool the diameter of said through-holes is equal to or larger than that of said conductive spheres used.

2. A method according to claim 1, wherein the depth of said through-holes of said tool is less than 1.5 times the diameter of said conductive spheres used.

3. A method according to claim 1, wherein the diameter of said through-holes of said tool is changed in the center axis of the through-holes.

4. A method according to claim 1, wherein before said alignment step, an adhesive supplying step is added to supply an adhesive selected from the group consisting of flux, soldering paste and conductive adhesive on said semiconductor device.

5. A method according to claim 4, wherein said adhesive supplied at said adhesive supplying step is selectively supplied to the surfaces of pads of said semiconductor device.

6. A method according to claim 5, wherein the selective supply of said adhesive on the pads of said semiconductor device at the adhesive supplying step is performed by printing.

7. A method according to claim 4, wherein said adhesive at said adhesive supplying step is supplied over the entire surface of said semiconductor device on which pads are provided.

8. A method according to claim 4, wherein a gap is provided between said tool and said semiconductor device so that said flux, solder paste or conductive adhesive supplied to said semiconductor device can be prevented from being made in contact with said tool.

9. A method according to claim 1, wherein in said ball charging process said conductive spheres are charged into said through-holes by the translational motion of a brush.

10. A method according to claim 1, wherein in said ball charging process said conductive spheres are charged into said through-holes by the translational motion of a squeegee.

11. A method according to claim 1, wherein in said ball charging process said conductive spheres are charged into said through-holes by an air flow.

12. A method according to claim 1, wherein in said ball charging process said conductive spheres are charged into said through-holes by vibration.

13. A method according to claim 1, wherein in said ball charging process said conductive spheres are charged into said through-holes by tilting said tool and said semiconductor device.

14. A method according to claim 1, wherein said places where said bumps are to be formed are pads of the semiconductor device, and wherein in said ball charging process a pressing step is added to depress said conductive spheres charged in said through-holes against the pads of said semiconductor device before said tool is removed from said semiconductor device.

15. A method according to claim 1, wherein in said ball charging process, before said tool is removed from said semiconductor device it is checked if each through-hole has a conductive sphere charged, and if there is a through-hole in which no sphere is charged, a charging re-trying step is performed to charge a conductive sphere into said through-hole in which no sphere is charged.

16. A method according to claim 1, wherein said semiconductor device is rinsed after said heating step.

17. A method according to claim 1, wherein said semiconductor device is cut into a plurality of parts after said heating step.

18. A method according to claim 1, wherein in said step of aligning said tool with said semiconductor device, an interval is provided between said tool and said semiconductor device by a spacer.

19. A method according to claim 1, wherein said places where said bumps are to be formed are pads of the semiconductor device, and wherein in said ball charging process, after said tool is removed from said semiconductor device a pressing step is provided to depress said conductive spheres charged in said through-holes against the pads of said semiconductor device.

20. A method according to claim 1, wherein said tool having through-holes has a thickness, at said through-holes, which is less than 1.5 times as large as the diameter of the conductive spheres.

21. A method of forming bumps in which conductive spheres are used to form bumps on a semiconductor device, comprising the steps of:

supplying an adhesive selected from the group consisting of flux, soldering paste and conductive adhesive on the semiconductor device, said adhesive being supplied over the entire surface of the semiconductor device on which pads of the semiconductor device are provided;

aligning a tool having through-holes with said semiconductor device so that said through-holes can be opposed to the places where said bumps are to be formed;

supplying said conductive spheres on said tool, charging said conductive spheres into said through-holes of said tool and removing said tool from said semiconductor device as a ball charging process; and heating said conductive spheres and said semiconductor device.

* * * * *